(12) United States Patent
Zhang et al.

(10) Patent No.: US 10,903,201 B2
(45) Date of Patent: Jan. 26, 2021

(54) SEMICONDUCTOR DEVICE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventors: Xin Gui Zhang, Shanghai (CN); Yao Qi Dong, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/234,753

(22) Filed: Dec. 28, 2018

(65) Prior Publication Data
US 2019/0206853 A1 Jul. 4, 2019

(30) Foreign Application Priority Data
Dec. 29, 2017 (CN) .......................... 2017 1 1486005

(51) Int. Cl.
*H01L 29/78* (2006.01)
*H01L 27/02* (2006.01)
(Continued)

(52) U.S. Cl.
CPC ...... *H01L 27/0207* (2013.01); *H01L 21/3105* (2013.01); *H01L 21/31116* (2013.01);
(Continued)

(58) Field of Classification Search
CPC ..... H01L 21/823431; H01L 21/823814; H01L 21/845; H01L 27/0886; H01L 27/0924;
(Continued)

(56) References Cited

U.S. PATENT DOCUMENTS

2008/0128797 A1* 6/2008 Dyer ................ H01L 29/66795
257/328
2010/0276756 A1* 11/2010 Rachmady ........ H01L 21/76232
257/365

(Continued)

*Primary Examiner* — Bitew A Dinke
(74) *Attorney, Agent, or Firm* — Anova Law Group, PLLC

(57) ABSTRACT

The present disclosure provides a semiconductor device and a manufacturing method thereof. The semiconductor device includes: a semiconductor substrate including a high-frequency-block group and a low-power-block group; high-frequency-type logic standard cells located on the high-frequency-block group, and having a high-frequency-type cell height, a high-frequency-type operating frequency, and a high-frequency-type power; low-power-type logic standard cells located on the low-power-block group, and having a low-power-type cell height, a low-power-type operating frequency, and a low-power-type power. The high-frequency-type cell height is higher than the low-power-type cell height. The high-frequency-type operating frequency is greater than the low-power-type operating frequency. The high-frequency-type power is greater than the low-power-type power. The high-frequency-type logic standard cells include high-frequency-type fins, and the low-power-type logic standard cells include low-power-type fins. An effective height of the high-frequency-type fins is greater than an effective height of the low-power-type fins.

7 Claims, 2 Drawing Sheets

(51) Int. Cl.
- H01L 21/311 (2006.01)
- H01L 21/762 (2006.01)
- H01L 21/3105 (2006.01)
- H01L 27/118 (2006.01)
- H01L 21/8234 (2006.01)
- H01L 27/088 (2006.01)
- H01L 29/66 (2006.01)
- H01L 27/105 (2006.01)

(52) U.S. Cl.
CPC .... *H01L 21/762* (2013.01); *H01L 21/823431* (2013.01); *H01L 27/0886* (2013.01); *H01L 27/11807* (2013.01); *H01L 29/66795* (2013.01); *H01L 29/785* (2013.01); *H01L 27/105* (2013.01)

(58) Field of Classification Search
CPC ........... H01L 27/0207; H01L 29/66795; H01L 29/785; H01L 27/11807; H01L 21/3105; H01L 21/762; H01L 21/31116; H01L 27/105

See application file for complete search history.

(56) References Cited

U.S. PATENT DOCUMENTS

| | | | | |
|---|---|---|---|---|
| 2011/0147848 A1* | 6/2011 | Kuhn | ................ | H01L 21/76229 257/368 |
| 2012/0313169 A1* | 12/2012 | Wahl | ..................... | H01L 21/845 257/347 |
| 2013/0224936 A1* | 8/2013 | Lee | ................. | H01L 21/823431 438/492 |
| 2013/0277720 A1* | 10/2013 | Kim | ..................... | H01L 29/785 257/288 |
| 2014/0042547 A1* | 2/2014 | Khakifirooz | ............ | H01L 28/92 257/368 |
| 2014/0065802 A1* | 3/2014 | Chang | ................... | H01L 21/845 438/479 |
| 2014/0167172 A1* | 6/2014 | Chen | ................... | H01L 29/6681 257/368 |
| 2015/0145068 A1* | 5/2015 | Chen | ................... | H01L 29/785 257/401 |
| 2016/0276482 A1* | 9/2016 | Kim | ..................... | H01L 27/0207 |
| 2016/0300725 A1* | 10/2016 | Ambati | ............... | H01L 29/0642 |
| 2016/0315084 A1* | 10/2016 | Wu | ...................... | H01L 27/0924 |
| 2016/0379888 A1* | 12/2016 | Chao | ................... | H01L 29/0642 438/283 |
| 2017/0162432 A1* | 6/2017 | Nien | ............. | H01L 21/823431 |
| 2018/0076092 A1* | 3/2018 | Gronheid | ........... | H01L 21/3081 |
| 2018/0190817 A1* | 7/2018 | Wu | ................... | H01L 29/42384 |
| 2019/0067483 A1* | 2/2019 | Chen | ................. | H01L 21/76229 |
| 2019/0148235 A1* | 5/2019 | Wang | .................. | H01L 21/3086 257/401 |
| 2019/0165171 A1* | 5/2019 | Huang | ............. | H01L 21/76829 |
| 2019/0214305 A1* | 7/2019 | Bao | ................... | H01L 29/78618 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201711486005.X, filed on Dec. 29, 2017, the content of which is incorporated herein by reference in its entirety.

TECHNICAL FIELD

The present disclosure generally relates to the field of semiconductor manufacturing and, in particular, to a semiconductor device and a fabrication method.

BACKGROUND

A metal-oxide-semiconductor (MOS) transistor is one of the most important devices in modern integrated circuits. The basic structure of a MOS transistor includes: a semiconductor substrate, and gate structures on a surface of the semiconductor substrate. The gate structure includes: a gate dielectric layer on the surface of the semiconductor substrate, a gate electrode layer on a surface of the gate dielectric layer, and source-drain doped regions in the semiconductor substrate on both sides of the gate structure.

With the development of semiconductor technology, the control capability of a conventional planar MOS transistor to the channel current is weakened, resulting in severe leakage current. A fin field effect transistor (Fin FET) is an emerging multi-gate device that generally includes fins protruding from a surface of a semiconductor substrate, gate structures covering a portion of a top surface and side surfaces of the fins, and source-drain doped regions in the fins located at both sides of the gate structures.

However, the performance of semiconductor devices including conventional fin field effect transistors still needs to be improved.

SUMMARY

One aspect of the present disclosure provides a semiconductor device. The semiconductor device includes: a semiconductor substrate including a high-frequency-block group and a low-power-block group; high-frequency-type logic standard cells, located on the high-frequency-block group, and having a high-frequency-type cell height, a high-frequency-type operating frequency, and a high-frequency-type power; low-power-type logic standard cells, located on the low-power-type-block group, and having a low-power-type cell height, a low-power-type operating frequency, and a low-power-type power. The high-frequency-type cell height is greater than the low-power-type cell height, the high-frequency-type operating frequency is greater than the low-power-type operating frequency, and the high-frequency-type power is higher than the low-power-type power. The high-frequency-type logic standard cells include high-frequency-type fins on the semiconductor substrate and the low-power-type logic standard cells include low-power-type fins on the semiconductor substrate. An effective height of the high-frequency-type fins is greater than an effective height of the low-power-type fins.

Another aspect of the present disclosure provides a method of forming a semiconductor device, including providing a semiconductor substrate including a high-frequency-block group and a low-power-block group; forming high-frequency-type logic standard cells on the high-frequency-block group of the semiconductor substrate, which have a high-frequency-type cell height, a high-frequency-type operating frequency, and a high-frequency-type power; forming low-power-type logic standard cells on the low-power-block group of the semiconductor substrate, which have a low-power-type cell height, a low-power-type operating frequency, and a low-power-type power. The high-frequency-type cell height is higher than the low-power-type cell height, the high-frequency-type operating frequency is larger than the low-power-type operating frequency, and the high-frequency-type power is greater than the low-power-type power. Forming the high-frequency-type logic standard cells includes: forming high-frequency-type fins on the high-frequency-block group of the semiconductor substrate. Forming the low-power-type logic standard cells includes: forming low-power-type fins on the low-power-block group of the semiconductor substrate. An effective height of the high-frequency-type fins is larger than an effective height of the low-power-type fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
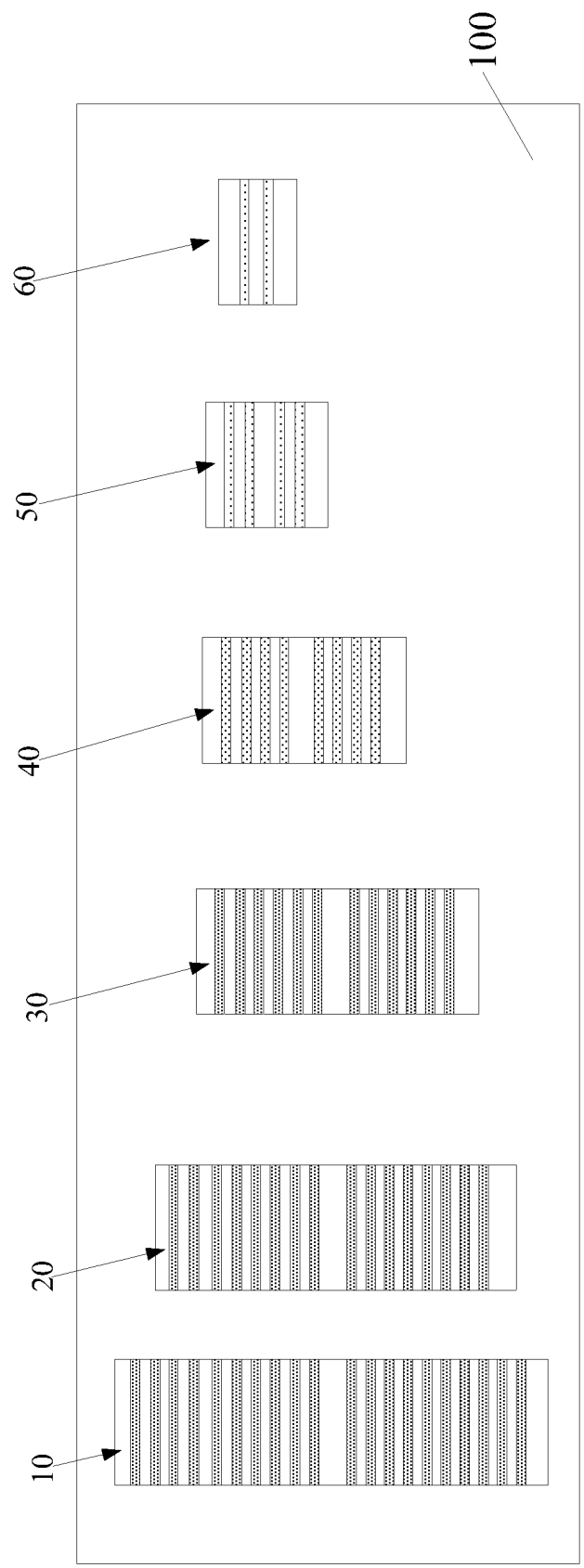
FIGS. 1 to 2 illustrate schematic views showing structures of an exemplary semiconductor device consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

The present disclosure provides a semiconductor device and a manufacturing method thereof. The semiconductor device includes: a semiconductor substrate including a high-frequency-block group and a low-power-block group; high-frequency-type logic standard cells located on the high-frequency-block group, and having a high-frequency-type cell height, a high-frequency-type operating frequency, and a high-frequency-type power; low-power-type logic standard cells located on the low-power-block group, and having a low-power-type cell height, a low-power-type operating frequency, and a low-power-type power. The high-frequency-type cell height is higher than the low-power-type cell height. The high-frequency-type operating frequency is greater than the low-power-type operating frequency. The high-frequency-type power is greater than the low-power-type power. The high-frequency-type logic standard cells include high-frequency-type fins, and the low-power-type logic standard cells include low-power-type fins. An effective height of the high-frequency-type fins is larger than an effective height of the low-power-type fins. The performance of the semiconductor device is improved.

A semiconductor device includes a semiconductor substrate; a first chip region and a second chip region that are separated from each other on the semiconductor substrate;

first logic standard cells located on the first chip region; and second logic standard cells located on the second chip region. The first logic standard cells have a first cell height and the second logic standard cells have a second cell height. The first cell height is greater than the second cell height. The first logic standard cells have a first operating frequency and a first power while the second logic standard cells have a second operating frequency and a second power. The first operating frequency is greater than the second operating frequency, and the first power is greater than the second power. The first logic standard cells include first fins on the semiconductor substrate and the second logic standard cells include second fins on the semiconductor substrate. The first fins have a first effective fin height and the second fins have a second effective fin height. The first effective fin height is the same as the second effective fin height.

The first logic standard cells are high frequency working devices, and the second logic standard cells are low power working devices.

Since the first effective fin height and the second effective fin height are the same, while adjusting the first effective fin height to optimize the frequency of the first logic standard cells, such as increasing the first effective fin height to increase the operating frequency of the first logic standard cells, the second effective fin height will also be increased accordingly. The increase in the second effective fin height increases the power of the second logic standard cells, therefore results in a decrease in the performance of the second logic standard cells. As such, the performance of the first logical standard cells and the second logical standard cells cannot be optimized at the same time.

The present disclosure provides a semiconductor device and a method of forming the semiconductor device, such that high-frequency-type logic standard cells include high-frequency-type fins on a semiconductor substrate and low-power-type logic standard cells include low-power-type fins on the semiconductor substrate. An effective height of the high-frequency-type fins is greater than an effective height of the low-power-type fins. The method improves the performance of the semiconductor device.

The above described objects, features and advantages of the present disclosure may become easier to be understood from the specific embodiments of the present disclosure described in detail below with reference to the accompanying drawings.

Figure 2:
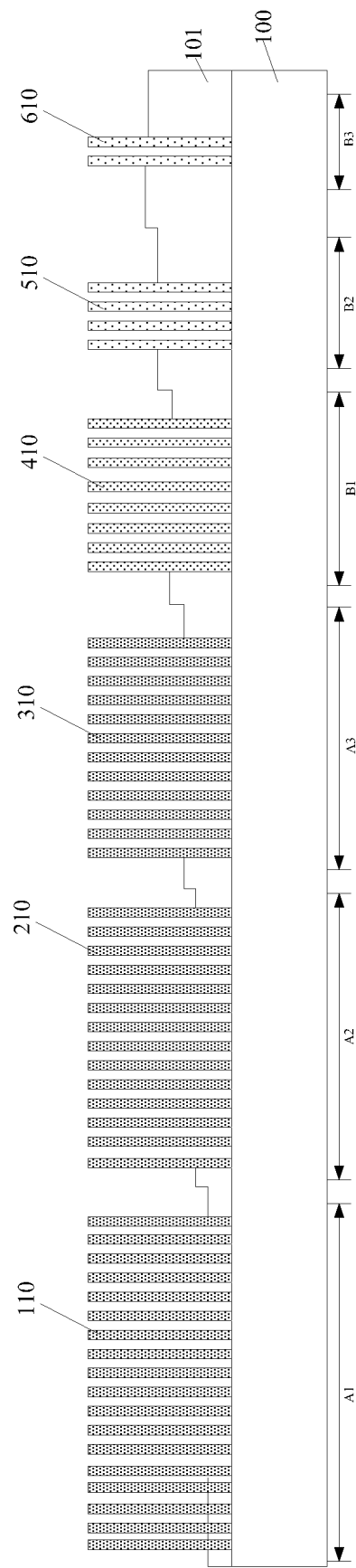

FIG. 1 illustrates a schematic structural view of chip cells, and FIG. 2 illustrates a schematic structural view of fins corresponding to the chip cells illustrated in FIG. 1. A semiconductor device includes a semiconductor substrate 100 including a high-frequency-block group and a low-power-block group; high-frequency-type logic standard cells located on the high-frequency-block group, and having a high-frequency-type cell height, a high-frequency-type operating frequency, and a high-frequency-type power; and low-power-type logic standard cells located on the low-power-block group, and having a low-power-type cell height, a low-power-type operating frequency, and a low-power-type power. The high-frequency-type cell height is greater than the low-power-type cell height, the high-frequency-type operating frequency is greater than the low-power-type operating frequency, and the high-frequency-type power is greater than the low-power-type power.

The high-frequency-type logic standard cells include high-frequency-type fins located on the semiconductor substrate 100, and the low-power-type logic standard cells include low-power-type fins located on the semiconductor substrate 100. An effective height of the high-frequency-type fins is greater than an effective height of the low-power-type fins.

In one embodiment, the material of the semiconductor substrate 100 is single crystal silicon. The semiconductor substrate 100 may also be one of polysilicon and amorphous silicon. The material of the semiconductor substrate 100 may also be a semiconductor material such as one of germanium, silicon germanium and gallium arsenide.

The high-frequency-block group includes a number of N (N is an integer greater than or equal to 2) mutually separated high-frequency-blocks, numbered from a first high-frequency-block to an $N^{th}$ high-frequency-block. Correspondingly, high-frequency-type logic standard cells are numbered from a first high-frequency-type logic standard cell to an $N^{th}$ high-frequency-type logic standard cell. The first high-frequency-type logic standard cell is located on the first high-frequency-block of the semiconductor substrate 100, and has a first high-frequency-type cell height $C_{h1}$, a first high-frequency-type operating frequency $f_{h1}$, and a first high-frequency-type power $P_{h1}$. The $N^{th}$ high-frequency-type logic standard cell is located on the $N^{th}$ high-frequency-block of the semiconductor substrate 100, and has an $N^{th}$ high-frequency-type cell height $C_{hN}$, an $N^{th}$ high-frequency-type operating frequency $f_{hN}$, and an $N^{th}$ high-frequency-type power $P_{hN}$. High-frequency-type cell heights are sequentially decreased from $C_{h1}$ to $C_{hN}$, high-frequency-type operating frequencies are sequentially decreased from $f_{h1}$ to $f_{hN}$, and high-frequency-type powers are sequentially decreased from $P_{h1}$ to $P_{hN}$.

The first high-frequency-type logic standard cell includes first high-frequency-type fins on the first high-frequency-block of the semiconductor substrate 100, and the $N^{th}$ high-frequency-type logic standard cell includes $N^{th}$ high-frequency-type fins on the $N^{th}$ high-frequency-block of the semiconductor substrate 100. Effective heights are sequentially decreased from the first high-frequency-type fins to the $N^{th}$ high-frequency-type fins.

In one embodiment, as shown in FIG. 1 and FIG. 2, N=3, as an example, the high-frequency-block group includes three mutually separated high-frequency-blocks, numbered as a first high-frequency-block A1, a second high-frequency-block A2, and a third high-frequency-block A3. High-frequency-type logic standard cells are numbered as a first high-frequency-type logic standard cell 10, a second high-frequency-type logic standard cell 20, and a third high-frequency-type logic standard cell 30.

In one embodiment, N=3, the first high-frequency-type logic standard cell 10 is located on the first high-frequency-block A1 of the semiconductor substrate 100, and has a first high-frequency-type cell height $C_{h1}$, a first high-frequency-type operating frequency $f_{h1}$, and a first high-frequency-type power $P_{h1}$. The second high-frequency-type logic standard cell 20 is located on the second high-frequency-block A2 of the semiconductor substrate 100, and has a second high-frequency-type cell height $C_{h2}$, a second high-frequency-type operating frequency $f_{h2}$, and a second high-frequency-type power $P_{h2}$. The third high-frequency-type logic standard cell 30 is located on the third high-frequency-block A3 of the semiconductor substrate 100, and has a third high-frequency-type cell height $C_{h3}$, a third high-frequency-type operating frequency $f_{h3}$, and a third high-frequency-type power $P_{h3}$. $C_{h1} > C_{h2} > C_{h3}$, $f_{h1} > f_{h2} > f_{h3}$, and $P_{h1} > P_{h2} > P_{h3}$.

The first high-frequency-type logic standard cell 10 includes first high-frequency-type fins 110 on the first high-frequency-block A1 of the semiconductor substrate 100, the second high-frequency-type logic standard cell 20 includes second high-frequency-type fins 210 on the second high-frequency-block A2 of the semiconductor substrate 100, and the third high-frequency-type logic standard cell 30 includes third high-frequency-type fins 310 on the third high-frequency-block A3 of the semiconductor substrate 100. An effective height of the first high-frequency-type fins 110 is greater than an effective height of the second high-frequency-type fins 210, and the effective height of the second high-frequency-type fins 210 is greater than an effective height of the third high-frequency-type fins 310.

In other embodiments, N can be equal to two.

In still other embodiments, N can be an integer greater than or equal to four.

In other certain embodiments, a high-frequency-block group can include only a first high-frequency-block. A corresponding high-frequency-type logic standard cell includes only a first high-frequency-type logic standard cell.

The first high-frequency-type logic standard cell 10 to the $N^{th}$ high-frequency-type logic standard cell have the same function type.

The first high-frequency-block A1 may also have other high-frequency-type logic standard cells with different functional types from the first high-frequency-type logic standard cell 10. The second high-frequency-block A2 may also have other high-frequency-type logic standard cells with different functional types from the second high-frequency-type logic standard cell 20. The third high-frequency-block A3 may also have other high-frequency-type logic standard cells with different functional types from the third high-frequency-type logic standard cell 30. The $N^{th}$ high-frequency-block may also have other high-frequency-type logic standard cells with different functional types from the $N^{th}$ high-frequency-type logic standard cell.

A direction of the first high-frequency-type cell height $C_{h1}$ is parallel to an arrangement direction of the first high-frequency-type fins 110. A direction of the second high-frequency-type cell height $C_{h2}$ is parallel to an arrangement direction of the second high-frequency-type fins 210. A direction of the third high-frequency-type cell height $C_{h3}$ is parallel to an arrangement direction of the third high-frequency-type fins 310. A direction of the $N^{th}$ high-frequency-type cell height $C_{hN}$ is parallel to an arrangement direction of the $N^{th}$ high-frequency-type fins.

The arrangement direction of the first high-frequency-type fins 110 is parallel to an extending direction of the first high-frequency-type fins 110. The arrangement direction of the second high-frequency-type fins 210 is parallel to an extending direction of the second high-frequency-type fins 210. The arrangement direction of the high-frequency-type fins 310 is parallel to an extending direction of the third high-frequency-type fins 310. The arrangement direction of the $N^{th}$ high-frequency-type fins is parallel to an extending direction of the $N^{th}$ high-frequency-type fins.

The first high-frequency-type fins have a first high-frequency-type fin arrangement density in the arrangement direction of the first high-frequency-type fins. The $N^{th}$ high-frequency-type fins have an $N^{th}$ high-frequency-type fin arrangement density in the arrangement direction of the $N^{th}$ high-frequency-type fins. High-frequency-type fin arrangement densities are sequentially decreased from the first high-frequency-type fin arrangement density to the $N^{th}$ high-frequency-type fin arrangement density.

In one embodiment, in the arrangement direction of the first high-frequency-type fins 110, the first high-frequency-type fins 110 have a first high-frequency-type fin arrangement density. In the arrangement direction of the second high-frequency-type fins 210, the second high-frequency-type fins 210 have a second high-frequency-type fin arrangement density. In the arrangement direction of the third high-frequency-type fins 310, the third high-frequency-type fins 310 have a third high-frequency-type fin arrangement density. The first high-frequency-type fin arrangement density is greater than the second high-frequency-type fin arrangement density, and the second high-frequency-type fin arrangement density is greater than the third high-frequency-type fin arrangement density.

In one embodiment, the semiconductor device further includes an isolation structure 101 on the semiconductor substrate 100. The isolation structure 101 covers a portion of a sidewall of each high-frequency-type fin from the first high-frequency-type fins 110 to the $N^{th}$ high-frequency-type fins. The material of the isolation structure 101 includes silicon oxide.

The effective height of the first high-frequency-type fins 110 is a distance from a top surface of the first high-frequency-type fins 110 to a surface of the isolation structure 101. The effective height of the second high-frequency-type fins 210 is a distance from a top surface of the second high-frequency-type fins 210 to the surface of the isolation structure 101. The effective height of the third high-frequency-type fins 310 is a distance from a top surface of the third high-frequency-type fins 310 to the surface of the isolation structure 101. The effective height of the $N^{th}$ high-frequency-type fins is a distance from a top surface of the $N^{th}$ high-frequency-type fins to the surface of the isolation structure 101.

It should be noted that "high frequency" refers to a frequency value higher than a threshold frequency. The threshold frequency is set according to the application field of the semiconductor device.

In one embodiment, when the semiconductor device is used for a central processing unit (CPU) of a computer or a server, the threshold frequency is 3 GHz. In another embodiment, when the semiconductor device is used for a smartphone or a television box, the threshold frequency is 1 GHz.

It should be noted that "low power" refers to a power value lower than a threshold power, and the threshold power is determined according to the design circuit of the semiconductor device. The larger the number of transistors in the semiconductor device, the greater the power of the semiconductor device, correspondingly the greater the threshold power.

The low-power-block group includes a number of M (M is an integer greater than or equal to 2) mutually discrete low-power-blocks, numbered from a first low-power-block to an $M^{th}$ low-power-block. Correspondingly, low-power-type logic standard cells are numbered from a first low-power-type logic standard cell to an $M^{th}$ low-power-type logic standard cell. The first low-power-type logic standard cell is located on the first low-power-block of the semiconductor substrate 100, and has a first low-power-type cell height $C_{d1}$, a first low-power-type operating frequency $f_{d1}$, and a first low-power-type power $P_{d1}$. The $M^{th}$ low-power-type logic standard cell is located on the $M^{th}$ low-power-block of the semiconductor substrate 100, and has an $M^{th}$ low-power-type cell height $C_{dM}$, an $M^{th}$ low-power-type operating frequency $f_{dM}$, and an $M^{th}$ low-power-type power $P_{dM}$. Low-power-type cell heights are sequentially decreased from $C_{d1}$ to $C_{dM}$, low-power-type operating frequencies are sequentially decreased from $f_{d1}$ to $f_{dM}$, and low-power-type powers are sequentially decreased from $P_{d1}$ to $P_{dM}$.

The first low-power-type logic standard cell includes first low-power-type fins located on the first low-power-block of the semiconductor substrate 100, and the $M^{th}$ low-power-type logic standard cell includes $M^{th}$ low-power-type fins located on the $M^{th}$ low-power-block of the semiconductor substrate. Effective heights are sequentially decreased from the first low-power-type fins to the $M^{th}$ low-power-type fins.

In one embodiment, as shown in FIG. 1 and FIG. 2, M=3, as an example, the low-power-block group includes three mutually separated low-power-blocks, numbered as a first low-power-block B1, a second low-power-block B2, and a third low-power-block B3. The low-power-type logic standard cells are numbered as a first low-power-type logic standard cell 40, a second low-power-type logic standard cell 50, and a third low-power-type logic standard cell 60.

In one embodiment, M=3, the first low-power-type logic standard cell 40 is located on the first low-power-block B1 of the semiconductor substrate 100, and has a first low-power-type cell height $C_{d1}$, a first low-power-type operating frequency $f_{d1}$, and a first low-power-type power $P_{d1}$. The second low-power-type logic standard cell 50 is located on the second low-power-block B2 of the semiconductor substrate 100, and has a second low-power-type cell height $C_{d2}$, a second low-power-type operating frequency $f_{d2}$, and a second low-power-type power $P_{d2}$. The third low-power-type logic standard cell 60 is located in the third low-power-block B3 of the semiconductor substrate 100, and has a third low-power-type cell height $C_{d3}$, a third low-power-type operating frequency $f_{d3}$, and a third low-power-type power $P_{d3}$. $C_{d1}>C_{d2}>C_{d3}$, $f_{d1}>f_{d2}>f_{d3}$, and $P_{d1}>P_{d2}>P_{d3}$.

The first low-power-type logic standard cell 40 includes first low-power-type fins 410 located on the first low-power-block B1 of the semiconductor substrate 100, the second low-power-type logic standard cell 50 includes second low-power-type fins 510 on the low-power-block B2 of the second semiconductor substrate 100, and the third low-power-type logic standard cell 60 includes third low-power-type fins 610 on the third low-power-block B3 of the semiconductor substrate 100. An effective height of the first low-power-type fins 410 is greater than an effective height of the second low-power-type fins 510, and the effective height of the second low-power-type fins 510 is greater than an effective height of the third low-power-type fins 610.

In other embodiments, M can be equal to 2, or M can be an integer greater than or equal to 4.

In other certain embodiments, a low-power-block group can include only a first low-power-block. A corresponding low-power-type logic standard cell can include only a first low power logic standard cell.

The first low power logic standard cell, the second low power logic standard cell to the $M^{th}$ low power logic standard cell have the same function type.

The first low-power-block B1 may also have other low-power-type logic standard cells with different functional types from the first low-power-type logic standard cell 40. The second low-power-block B2 may also have other low-power-type logic standard cells with different functional types from the second low-power-type logic standard cell 50. The third low-power-block B3 may also have other low-power-type logic standard cells with different functional types from the third low-power-type logic standard cell 60. The $M^{th}$ low-power-block may also have other low-power-type logic standard cells with different functional types from the $M^{th}$ low-power-type logic standard cell.

A direction of the first low-power-type cell height $C_{d1}$ is parallel to an arrangement direction of the first low-power-type fins 410. A direction of the second low-power-type cell height $C_{d2}$ is parallel to an arrangement direction of the second low-power-type fins 510. A direction of the third low-power-type cell height $C_{d3}$ is parallel to an arrangement direction of the third low-power-type fins 610. A direction of the $M^{th}$ low-power-type cell height $C_{hM}$ is parallel to an arrangement direction of the $M^{th}$ low-power-type fins.

The first low-power-type fins have a first low-power-type fin arrangement density in the arrangement direction of the first low-power-type fins, and the $M^{th}$ low-power-type fins have an $M^{th}$ low-power-type fin arrangement density in the arrangement direction of the $M^{th}$ low-power-type fins. Low-power-type fin arrangement densities are sequentially decreased from the first low-power-type fin arrangement density to the $M^{th}$ low-power-type fin arrangement density.

In one embodiment, the first low-power-type fins 410 have a first low-power-type fin arrangement density in the arrangement direction of the first low-power-type fins 410. The second low-power-type fins 510 have a second low-power-type fin arrangement density in the arrangement direction of the second low-power-type fins 510. The third low-power-type fins 610 have a third low-power-type fin arrangement density in the arrangement direction of the third low-power-type fins 610. The first low-power-type fin arrangement density is greater than the second low-power-type fin arrangement density, and the second low-power-type fin arrangement density is greater than the third low-power-type fin arrangement density.

The isolation structure also covers a portion of a sidewall of each low-power-type fin from the first low-power-type fins to the $M^{th}$ low-power-type fins. The effective height of the first low-power-type fins is a distance from a top surface of the first low-power-type fins to a surface of the isolation structure, and the effective height of the $M^{th}$ low-power-type fins is a distance from a top surface of the $M^{th}$ low-power-type fins to the surface of the isolation structure.

The present disclosure also provides a method of forming the above semiconductor device, including: providing a semiconductor substrate 100 including a high-frequency-block group and a low-power-block group; forming high-frequency-type logic standard cells on the high-frequency-block group of the semiconductor substrate 100, which have a high-frequency-type cell height, a high-frequency-type operating frequency, and a high-frequency-type power; forming low-power-type logic standard cells on the low-power-block group of the semiconductor substrate 100, which have a low-power-type cell height, a low-power-type operating frequency, and a low-power-type power. The high-frequency-type cell height is greater than the low-power-type cell height, the high-frequency-type operating frequency is greater than the low-power-type operating frequency, and the high-frequency-type power is greater than the low-power-type power.

Forming the high-frequency-type logic standard cells includes forming high-frequency-type fins located on the high-frequency-block group of the semiconductor substrate 100.

Forming the low-power-type logic standard cells includes forming low-power-type fins located on the low-power-block group of the semiconductor substrate 100. An effective height of the high-frequency-type fins is greater than an effective height of the low-power-type fins.

The high-frequency-block group includes a number of N mutually discrete high-frequency-blocks, numbered from a first high-frequency-block to an $N^{th}$ high-frequency-block, and N is an integer greater than or equal to 2. High-frequency-type logic standard cells are numbered from a first high-frequency-type logic standard cell to an $N^{th}$ highfrequency-type logic standard cell. The first high-frequency-type logic standard cell is located on the first high-frequency-block of the semiconductor substrate, and has a first high-frequency-type cell height $C_{h1}$, a first high-frequency-type operating frequency $f_{h1}$, and a first high-frequency-type power $P_{h1}$. The $N^{th}$ high-frequency-type logic standard cell is located on the N high-frequency-block of the semiconductor substrate, and has an $N^{th}$ high-frequency-type cell height $C_{hN}$, an $N^{th}$ high-frequency-type operating frequency $f_{hN}$, and an $N^{th}$ high-frequency-type power $P_{hN}$. High-frequency-type cell heights are sequentially decreased from $C_{h1}$ to $C_{hN}$, high-frequency-type operating frequencies are sequentially decreased from $f_{h1}$ to $f_{hN}$, and high-frequency-type powers are sequentially decreased from $P_{h1}$ to $P_{hN}$.

The first high-frequency-type logic standard cell includes first high-frequency-type fins on the first high-frequency-block of the semiconductor substrate, and the $N^{th}$ high-frequency-type logic standard cell includes $N^{th}$ high-frequency-type fins on the $N^{th}$ high-frequency-block of the semiconductor substrate. Effective heights are sequentially decreased from the first high-frequency-type fins to the $N^{th}$ high-frequency-type fins.

An arrangement direction of the first high-frequency-type fins is parallel to an extending direction of the first high-frequency-type fins. An arrangement direction of the $N^{th}$ high-frequency-type fins is parallel to an extending direction of the $N^{th}$ high-frequency-type fins. In the arrangement direction of the first high-frequency-type fins, the first high-frequency-type fins have a first high-frequency-type fin arrangement density. In the arrangement direction of the $N^{th}$ high-frequency-type fins, the $N^{th}$ high-frequency-type fins have an $N^{th}$ high-frequency-type fin arrangement density. High-frequency-type fin arrangement densities are sequentially decreased from the first high-frequency-type fin arrangement density to the $N^{th}$ high-frequency-type fin arrangement density.

The low-power-block group includes a number of M mutually discrete low-power-blocks, number from a first low-power-block to an $M^{th}$ low-power-block, and M is an integer greater than or equal to 2. Low-power-type logic standard cells are numbered from a first low-power-type logic standard cell to an $M^{th}$ low-power-type logic standard cell. The first low-power-type logic standard cell is located on the first low-power-block of the semiconductor substrate, and has a first low-power-type cell height $C_{d1}$, a first low-power-type operating frequency $f_{d1}$, and a first low-power-type power $P_{d1}$. The $M^{th}$ low-power-type logic standard cell is located on the $M^{th}$ low-power-block of the semiconductor substrate, and has an $M^{th}$ low-power-type cell height $C_{dM}$, an $M^{th}$ low-power-type operating frequency $f_{dM}$, and an $M^{th}$ low-power-type power $P_{dM}$. Low-power-type cell heights are sequentially decreased from $C_{d1}$ to $C_{dM}$, low-power-type operating frequencies are sequentially decreased from $f_{d1}$ to $f_{dM}$, low-power-type powers are sequentially decreased from $P_{d1}$ to $P_{dM}$.

The first low-power-type logic standard cell includes first low-power-type fins located on the first low-power-block of the semiconductor substrate, and the $M^{th}$ low-power-type logic standard cell includes $M^{th}$ low-power-type fins located on the $M^{th}$ low-power-block of the semiconductor substrate. Effective heights are sequentially decreased from the first low-power-type fins to the $M^{th}$ low-power-type fins.

An arrangement direction of the first low-power-type fins is parallel to an extending direction of the first low-power-type fins. An arrangement direction of the $M^{th}$ low-power-type fins is parallel to an extending direction of the $M^{th}$ low-power-type fins. The first low-power-type fins have a first low-power-type fin arrangement density in the arrangement direction of the first low-power-type fins. The $M^{th}$ low-power-type fins have an $M^{th}$ low-power-type fin arrangement density in the arrangement direction of the $M^{th}$ low-power-type fins. Low-power-type fin arrangement densities are sequentially decreased from the first low-power-type fin arrangement density to the $M^{th}$ low-power-type fin arrangement density.

In one embodiment, the method further includes forming an isolation structure 101 on the semiconductor substrate 100 after forming the high-frequency-type fins and the low-power-type fins. The isolation structure 101 covers a portion of a sidewall of each high-frequency-type fin from the high-frequency-type fins and a portion of a sidewall of each low-power-type fin from the low-power-type fins. For example, the isolation structure 101 covers a portion of a sidewall of each first high-frequency-type fin from the first high-frequency-type fins 110 to the $N^{th}$ high-frequency-type fins, and a portion of a sidewall of each low-power-type fin from the first low-power-type fins to the $M^{th}$ low-power-type fins. The effective height of the first high-frequency-type fins is a distance from a top surface of the first high-frequency-type fins 110 to a surface of the isolation structure 101. The effective height of the $N^{th}$ high-frequency-type fins is a distance from a top surface of the $N^{th}$ high-frequency-type fins to the surface of the isolation structure 101. The effective height of the first low-power-type fins is a distance from a top surface of the first low-power-type fins to the surface of the isolation structure. The effective height of the $M^{th}$ low-power-type fins is a distance from a top surface of the $M^{th}$ low-power-type fins to the surface of the isolation structure.

The method of forming the isolation structure 101 includes forming isolation structure films on the high-frequency-block group and the low-power-block group of the semiconductor substrate 100, and on the high-frequency-type fins and the low-power-type fins. The isolation structure films are etched back until a portion of the sidewall of each high-frequency-type fin from the high-frequency-type fins and a portion of the sidewall of each low-power-type fin from the low-power-type fins are exposed to form the isolation structure 101.

In one embodiment, the difference between the effective height of the high-frequency-type fins and the effective height of the low-power-type fins is adjusted by combining the difference between the high-frequency-type fin arrangement density and the low-power-type fin arrangement density, and the parameters of etching back the isolation structure films. In the process of etching back the isolation structure film of the high-frequency-block group, the isolation structure film of the low-power-block group is also etched back to form the isolation structure.

In one embodiment, the difference between the effective height of the first high-frequency-type fins to the effective height of the $N^{th}$ high-frequency-type fins is adjusted by combining the difference between the first high-frequency-type fin arrangement density to the $N^{th}$ high-frequency-type fin arrangement density, and the parameters of etching back the isolation structure films.

In one embodiment, the difference between the effective height of the first low-power-type fins to the effective height of the $M^{th}$ low-power-type fins is adjusted by combining the difference between the first low-power-type fin arrangement density to the $M^{th}$ low-power-type fin arrangement density, and the parameters of etching back the isolation structure films.

In one embodiment, a process of etching back the isolation structure films includes a Certas dry etching process including a remote dry etching and an in-situ annealing after the remote dry etching. Parameters of the remote dry etching include: gases including HF and $NH_3$, a flow rate of $NH_3$ of about 50 sccm to about 500 sccm, a flow rate of HF of about 20 sccm to about 300 sccm, a chamber pressure of about 2000 mtorr to about 5000 mtorr, and a temperature of about 20° C. to about 200° C. Parameters of the in-situ annealing include: a temperature of about 100° C. to about 200° C.

In another embodiment, the difference between the effective height of the high-frequency-type fins and the effective height of the low-power-type fins is not dependent on the difference between the arrangement density of the high-frequency-type fins and the arrangement density of the low-power-type fins.

For example, the method for etching back the isolation structure films includes: etching back the isolation structure film of the low-power-block group after etching back the isolation structure film of the high-frequency-block group, or etching back the isolation structure film of the high-frequency-block group after etching back the isolation structure film of the low-power-block group.

For example, when effective heights are sequentially decreased from the first high-frequency-type fins to the $N^{th}$ high-frequency-type fins, a total of N times of etching the high-frequency-block group are used in the process of etching back the isolation structure film of the high-frequency-block group. In each time etching the isolation structure film of the high-frequency-block group, the isolation structure film of only one block of the first high-frequency-block to the $N^{th}$ high-frequency-block is etched, and the isolation structure of other blocks is covered by a mask layer.

For example, when effective heights are sequentially decreased from the first low-power-type fins to the $M^{th}$ low-power-type fins, a total of M times of etching the low-power-block group are used in the process of etching back the isolation structure film of the low-power-block group. In each time etching the isolation structure film of the low-power-block group, the isolation structure film of only one block of the first low-power-block to the $M^{th}$ low-power-block is etched, and the isolation structure of other blocks is covered by a mask layer.

As such, in the method of forming the semiconductor device provided by the technical solution of the present disclosure, the high-frequency-type logic standard cells and the low-power-type logic standard cells are formed in the same process. The effective height of the high-frequency-type fins is greater than the effective height of the low-power-type fins. The effective height of the high-frequency-type fins is larger, so the operating frequency of the high-frequency-type logic standard cells can be increased. The effective height of the low-power-type fins is smaller, thus the power of the low-power-type logic standard cells can be reduced. Therefore, it is possible to simultaneously optimize the performance of the high-frequency-type logic standard cells and the low-power-type logic standard cells. The performance of the semiconductor device is improved.

In the semiconductor device provided by the technical solution of the present disclosure, the effective height of the high-frequency-type fins is greater than the effective height of the low-power-type fins. The effective height of the high-frequency-type fins is larger, so the operating frequency of the high-frequency-type logic standard cells can be increased. The effective height of the low-power-type fins is smaller, thus the power of the low-power-type logic standard cells can be reduced. Therefore, it is possible to simultaneously optimize the performance of the high-frequency-type logic standard cells and the low-power-type logic standard cells. The performance of the semiconductor device is improved.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A semiconductor device, comprising:
    a semiconductor substrate, including a high-frequency-block group and a low-power-block group;
    high-frequency-type logic standard cells, located on the high-frequency-block group, and having a high-frequency-type cell height, a high-frequency-type operating frequency, and a high-frequency-type power; and
    low-power-type logic standard cells, located on the low-power-block group, and having a low-power-type cell height, a low-power-type operating frequency, and a low-power-type power,
    wherein:
    the high-frequency-type cell height is greater than the low-power-type cell height, the high-frequency-type operating frequency is greater than the low-power-type operating frequency, and the high-frequency-type power is greater than the low-power-type power;
    the high-frequency-type logic standard cells include high-frequency-type fins on the semiconductor substrate, and the low-power-type logic standard cells include low-power-type fins on the semiconductor substrate, wherein an effective height of the high-frequency-type fins is greater than an effective height of the low-power-type fins;
    a fin arrangement density of the high-frequency-type fins in an arrangement direction of the high-frequency-type fins is greater than a fin arrangement density of the low-frequency-type fins in an arrangement direction of the high-frequency-type fins; and
    the fin arrangement density of the high-frequency-type fins in the arrangement direction of the high-frequency-type fins is are sequentially decreased with the high-frequency-type operating frequency, and a fin arrangement density of the low-frequency-type fins in the arrangement direction of the low-frequency-type fins is sequentially decreasing with the low-frequency-type operating frequency.

2. The semiconductor device according to claim 1, wherein:
    the high-frequency-block group includes a number of N mutually discrete high-frequency-blocks, numbered from a first high-frequency-block to an $N^{th}$ high-frequency-block, and N is an integer greater than or equal to 2;
    the high-frequency-type logic standard cells are numbered from a first high-frequency-type logic standard cell to an $N^{th}$ high-frequency-type logic standard cell,
    the first high-frequency-type logic standard cell is located on the first high-frequency-block of the semiconductor substrate, and has a first high-frequency-type cell height $C_{h1}$, a first high-frequency-type operating frequency $f_{h1}$, and a first high-frequency-type power $P_{h1}$,
    the $N^{th}$ high-frequency-type logic standard cell is located on the $N^{th}$ high-frequency-block of the semiconductor substrate, and has an $N^{th}$ high-frequencytype cell height $C_{hN}$, an $N^{th}$ high-frequency-type operating frequency $f_{hN}$, and an $N^{th}$ high-frequency-type power $P_{hN}$, wherein high-frequency-type cell heights are sequentially decreased from $C_{h1}$ to $C_{hN}$, high-frequency-type operating frequencies are sequentially decreased from $f_{h1}$ to $f_{hN}$, and high-frequency-type powers are sequentially decreased from $P_{h1}$ to $P_{hN}$; and the first high-frequency-type logic standard cell includes first high-frequency-type fins on the first high-frequency-block of the semiconductor substrate, and the $N^{th}$ high-frequency-type logic standard cell includes $N^{th}$ high-frequency-type fins on the $N^{th}$ high-frequency-block of the semiconductor substrate, wherein effective heights are sequentially decreased from the first high-frequency-type fins to the $N^{th}$ high-frequency-type fins.

3. The semiconductor device according to claim 2, further comprising:

an isolation structure on the semiconductor substrate, wherein the isolation structure covers a portion of a sidewall of each high-frequency-type fin from the first high-frequency-type fins to the $N^{th}$ high-frequency-type fins, wherein:

the effective height of the first high-frequency-type fins is a distance from a top surface of the first high-frequency-type fins to a surface of the isolation structure, and the effective height of the $N^{th}$ high-frequency-type fins is a distance from a top surface of the $N^{th}$ high-frequency-type fins to the surface of the isolation structure.

4. The semiconductor device according to claim 2, wherein:

an arrangement direction of the first high-frequency-type fins is parallel to an extending direction of the first high-frequency-type fins, and an arrangement direction of the $N^{th}$ high-frequency-type fins is parallel to an extending direction of the $N^{th}$ high-frequency-type fins;

in the arrangement direction of the first high-frequency-type fins, the first high-frequency-type fins have a first high-frequency-type fin arrangement density, and in the arrangement direction of the $N^{th}$ high-frequency-type fins, the $N^{th}$ high-frequency-type fins have an $N^{th}$ high-frequency-type fin arrangement density; and high-frequency-type fin arrangement densities are sequentially decreased from the first high-frequency-type fin arrangement density to the $N^{th}$ high-frequency-type fin arrangement density.

5. The semiconductor device according to claim 1, wherein:

the low-power-block group includes a number of M mutually discrete low-power-blocks, numbered from a first low-power-block to an $M^{th}$ low-power-block, and M is an integer greater than or equal to 2;

the low-power-type logic standard cells are numbered from a first low-power-type logic standard cell to an $M^{th}$ low-power-type logic standard cell, the first low-power-type logic standard cell is located on the first low-power-block of the semiconductor substrate, and has a first low-power-type cell height $C_{d1}$, a first low-power-type operating frequency $f_{d1}$, and a first low-power-type power $P_{d1}$, the $M^{th}$ low-power-type logic standard cell is located on the $M^{th}$ low-power-block of the semiconductor substrate, and has an $M^{th}$ low-power-type cell height $C_{dM}$, an $M^{th}$ low-power-type operating frequency $f_{dM}$, and an $M^{th}$ low-power-type power $P_{dN}$, wherein low-power-type cell heights are sequentially decreased from $C_{d1}$ to $C_{dM}$, low-power-type operating frequencies are sequentially decreased from $f_{d1}$ to $f_{dM}$, and low-power-type powers are sequentially decreased from $P_{d1}$ to $P_{dM}$; and the first low-power-type logic standard cell includes first low-power-type fins located on the first low-power-block of the semiconductor substrate, and the $M^{th}$ low-power-type logic standard cell includes $M^{th}$ low-power-type fins located on the $M^{th}$ low-power-block of the semiconductor substrate, wherein effective heights are sequentially decreased from the first low-power-type fins to the $M^{th}$ low-power-type fins.

6. The semiconductor device according to claim 5, further comprising:

an isolation structure on the semiconductor substrate, wherein the isolation structure covers a portion of a sidewall of each low-power-type fin from the first low-power-type fins to the $M^{th}$ low-power-type fins, wherein:

the effective height of the first low-power-type fins is a distance from a top surface of the first low-power-type fins to a surface of the isolation structure, and the effective height of the $M^{th}$ low-power-type fins is a distance from a top surface of the $M^{th}$ low-power-type fins to the surface of the isolation structure.

7. The semiconductor device according to claim 5, wherein:

an arrangement direction of the first low-power-type fins is parallel to an extending direction of the first low-power-type fins, and an arrangement direction of the $M^{th}$ low-power-type fins is parallel to an extending direction of the $M^{th}$ low-power-type fins;

in the arrangement direction of the first low-power-type fins, the first low-power-type fins have a first low-power-type fin arrangement density, and in the arrangement direction of the $M^{th}$ low-power-type fins, the $M^{th}$ low-power-type fins have an $M^{th}$ low-power-type fin arrangement density; and low-power-type fin arrangement densities are sequentially decreased from the first low-power-type fin arrangement density to the $M^{th}$ low-power-type fin arrangement density.

\* \* \* \* \*